(12) United States Patent
Peumans et al.

(10) Patent No.: US 7,592,539 B2
(45) Date of Patent: Sep. 22, 2009

(54) SOLID STATE PHOTOSENSITIVE DEVICES WHICH EMPLOY ISOLATED PHOTOSYNTHETIC COMPLEXES

(75) Inventors: Peter Peumans, Palo Alto, CA (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 691 days.

(21) Appl. No.: 10/704,226

(22) Filed: Nov. 7, 2003

(65) Prior Publication Data
US 2005/0098726 A1 May 12, 2005

(51) Int. Cl.
*H01L 31/00* (2006.01)
(52) U.S. Cl. .................... 136/263; 136/256
(58) Field of Classification Search .......... 136/263, 136/256
See application file for complete search history.

(56) References Cited

U.S. PATENT DOCUMENTS

| | | | |
|---|---|---|---|
| 4,360,703 | A | 11/1982 | Bolton et al. |
| 6,162,278 | A | 12/2000 | Hu |
| 6,231,983 | B1 | 5/2001 | Lee et al. |
| 6,333,458 | B1 | 12/2001 | Forrest et al. |
| 6,447,663 | B1 | 9/2002 | Lee et al. |
| 6,451,415 | B1 * | 9/2002 | Forrest et al. ........... 428/212 |
| 6,468,819 | B1 | 10/2002 | Kim et al. |
| 2002/0189666 | A1 | 12/2002 | Forrest et al. |

FOREIGN PATENT DOCUMENTS

WO   2004/030029   4/2004

OTHER PUBLICATIONS

Lukins, P. B., Direct observation of semiconduction and photovoltaic behaviour in single molecules of the Photosystem II reaction centre, Chemical Physics Letters, 321, 2000, pp. 13-20.*

Chikashi Nakamura, et al., Self-Assembling Photosynthetic Reaction Centers on Electrodes for Current Generation, Applied Biochemistry and Biotechnology, vol. 2000, pp. 401-408 2000.

(Continued)

*Primary Examiner*—Jeffrey T. Barton
(74) *Attorney, Agent, or Firm*—McDermott Will & Emery LLP

(57) ABSTRACT

Solid state photosensitive devices including photovoltaic devices are provided which comprise a first electrode and a second electrode in superposed relation; and at least one isolated Light Harvesting Complex (LHC) between the electrodes. Preferred photosensitive devices comprise an electron transport layer formed of a first photoconductive organic semiconductor material, adjacent to the LHC, disposed between the first electrode and the LHC; and a hole transport layer formed of a second photoconductive organic semiconductor material, adjacent to the LHC, disposed between the second electrode and the LHC. Solid state photosensitive devices of the present invention may comprise at least one additional layer of photoconductive organic semiconductor material disposed between the first electrode and the electron transport layer; and at least one additional layer of photoconductive organic semiconductor material, disposed between the second electrode and the hole transport layer. Methods of generating photocurrent are provided which comprise exposing a photovoltaic device of the present invention to light. Electronic devices are provided which comprise a solid state photosensitive device of the present invention.

28 Claims, 9 Drawing Sheets

OTHER PUBLICATIONS

L. Croisetiere, et al., A Simple Mediatorless Amperometric Method Using the Cyanobacterium Synechococcus Leopoliensis For the Detection of Phytotoxic Pollutants, Appl. Microbiol Biotechnol (2001) 56: pp. 261-264.

Jean-Guy Villar, Photoelectrochemical Effects in The Electrolyte-Pigment-Metal System. I. Metal-Free Phthalocyanine Film Description of Short-Circuit Photocurrents for thin Films of Pigment, Journal of Bioenergetics and Biomembranes (1976) 8, pp. 173-187.

Greenbaum et al., Biomolecular Electronics: Vectorial Arrays of Photosynthetic Reaction Centers, Physical, Review Letters, Oct. 27, 1997, vol. 79, No. 17, pp. 3294-3297.

Greenbaum, Biomolecular electronics: observation of oriented photocurrents by entrapped platinized chloroplasts, Bioelectrochemistry and Bioenergetics, 21 (1989), pp. 171-177.

Greenbaum et al., Molecular electronics of a single photosystem I reaction center: Studies with scanning tunneling microscopy and spectroscopy, Proc. Natl. Acad. Sci. USA vol. 92, pp. 1965-1969, Mar. 1995.

S.R. Forrest, "Ultrathin Organic Films Grown by Organic Molecular Beam Deposition and Related Techniques," Chem. Rev., vol. 97, pp. 1793-1896 (1997).

Greenbaum, "Platinized Chloroplasts: A Novel Photocatalytic Material", Science 230, No. 4732, pp. 1373-1375 (Dec. 20, 1985).

Lee, et al., "Measurement of Electrostatic Potentials above Oriented Single Photosynthetic Reaction Centers", J. Phys. Chem. B, 104, pp. 2439-2443 (2000).

Greenbaum, "Vectorial Photocurrents and Photoconductivity in Matalized Chloroplasts", J. Phys. Chem., 94, pp. 6151-6153, 1990.

Lee, et al., "Molecular electronics of a single photosystem I reaction center: Studies with scanning tunneling microscopy and spectroscopy", Proc. Natl. Acad. Sci. USA, vol. 92, pp. 1965-1969, Mar. 1995.

Schubert, et al., Photosystem I of Synechococcus elongatus at 4 A Resolution: Comprehensive Structure Analysis, J. Mol. Biol. 272, pp. 741-768 (1997).

Fromme, et al., "Improved isolation and crystallization of Photosystem I for structural analysis", Biochimica et Biophysica Acta, 1365, pp. 175-184 (1998).

Cogdell, et al., "The Isolation and Partial Characterisation of the Light-Harvesting Pigment-Protein Complement of *Rhodopseudomonas acidophila*", Biochimica et Biophysica Acta, 722, pp. 427-435 (1983).

McDermott, et al., "Crystal structure of an integral membrane light-harvesting complex from 1995 photosynthetic bacteria", Nature, vol. 374, pp. 517-521 (Apr. 6, 1995).

Papiz, et al., "Crystallization and characterization of two crystal forms of the B800-850 light-harvesting complex from *Rhodopseudomonas acidophila* strain 10050", Journal of Molecular Biology 209, pp. 833-835 (1989).

Fenna et al., "Chlorophyll arrangement in a bacteriochlorophyll protein from chlorobium limicola", Nature, vol. 258, pp. 573-577 (Dec. 18, 1975).

Sundstrom, et al., "Photosynthetic light-harvesting: recording dynamics and structure of purple bacterial LH2 reveals function of photosynthetic unit", Journal of Physical Chemistry B, 103, pp. 2327-2346 (1999).

Renger et al., "Ultrafast excitation energy transfer dynamics in photosynthetic pigment-protein complexes", Physics Reports, vol. 343, No. 3, pp. 137-254 (2001).

C. Nakamura, et al., "Self-Assembling Photosynthetic Reaction Centers on Electrodes for Current Generation", Applied Biochemistry and Biotechnology, vol. 84-86, 2000, pp. 401-408.

L. Croisetiere, et al., "A simple mediatorless amperometric method using the cyanobacterium *Synechococcus leopoliensis* for the detection of phytotoxic pollutants", Appl. Micorbiol Biotechnol, 2001, 56: pp. 261-264.

Villar, et al., "Photoelectrochemical effects in the electrolyte-pigment-metal system. I. Metal-Free phthalocyanine film description of short-circuit photocurrents for thin films of pigment ", Journal of Bioenergetics and Biomembranes (1976) 8, pp. 173-187.

I. Lee, et al., "Biomolecular Electronics: Vectorial arrays of photosynthetic reaction centers", Physical Review Letters, vol. 79, No. 17, pp. 3294-3297, Oct. 27, 1997.

E. Greenbaum, "Biomolecular electronics: observation of oriented photocurrents by entrapped platinized chloroplasts, Bioelectrochemistry and Bioenergetics", 21 (1989) pp. 171-177.

Imahori et al., "Nanostructured artificial photosynthesis", J. Photochemistry and Photobiology C, vol. 4, p. 51-83, 2003.

Yoshino et al., "Novel photovoltaic devices based on donor-acceptor molecular and conducting polymer systems", IEEE Transactions on Electron Devices, vol. 44, No. 8, pp. 1315-1324, Aug. 1997.

Zhao et al., "Photoelectric conversion of photosynthetic reaction center in multilayered films fabricated by layer-by-layer assembly", Electrochimica Acta, Vo. 47, No. 12, p. 2013-2017, May 2002.

Lukins, B Single Molecule Electron Tunneling Spectroscopy of the Higher Plant Light-Harvesting Complex LHC II, in *Biochemical and Biophysical Research Communications*, vol. 256, pp. 288-292 (1999).

\* cited by examiner

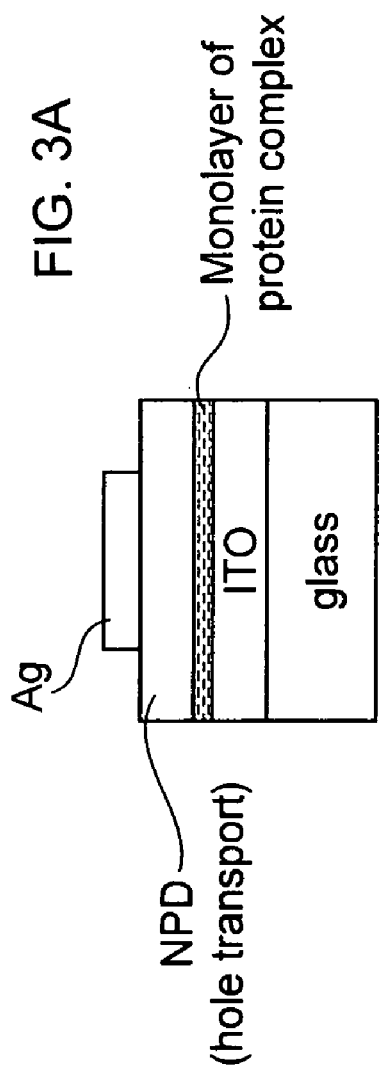
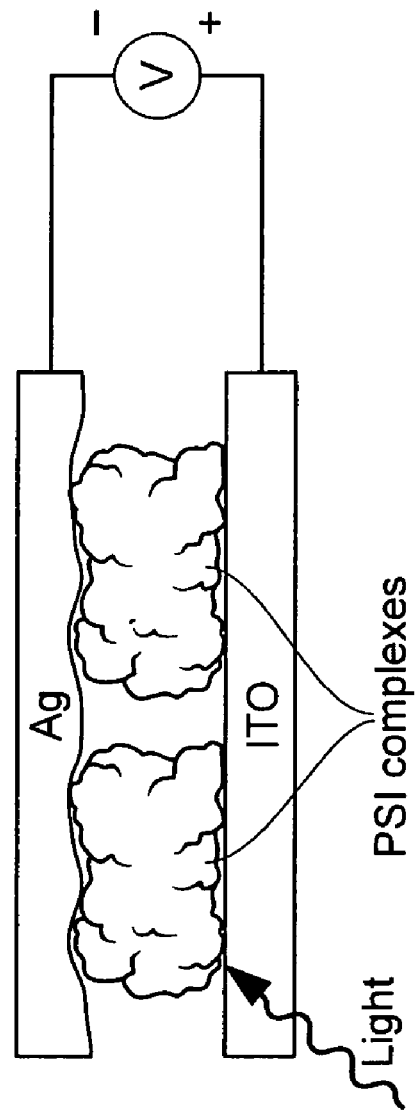

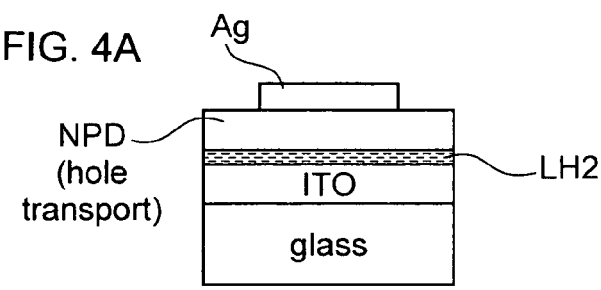
FIG. 4A
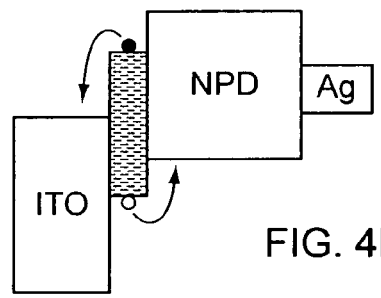
FIG. 4B
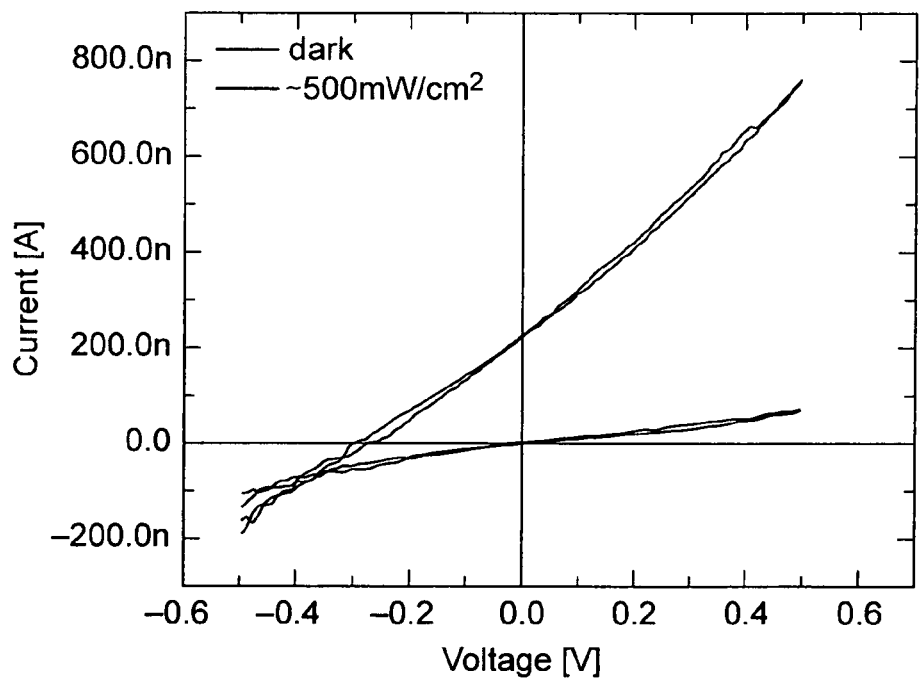
FIG. 4C — Photocurrent under white light (AM1.5) illumination

Molecular sensor
Photon energy source
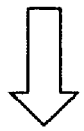
Molecular trigger ⟶ LHC ⟶ Electrical output
Molecular logic element
Photon energy source
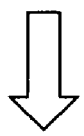
Molecular trigger ⟶ LHC ⟶ Molecular output
or
Electrical input ⟶ LHC ⟶ Electrical output
FIG. 6

SOLID STATE PHOTOSENSITIVE DEVICES WHICH EMPLOY ISOLATED PHOTOSYNTHETIC COMPLEXES

UNITED STATES GOVERNMENT RIGHTS

This invention was made with U.S. Government support under Contract No. 341-6239 and Grant No. F49620-01-1-0559 awarded by the U.S. Air Force Office of Scientific Research. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to solid state photosensitive devices, including photovoltaic devices, which comprise a first electrode and a second electrode in superposed relation; and at least one isolated photosynthetic complex (Light Harvesting Complex (LHC), e.g., PSI (Photosystem I, from spinach, for example), and/or LH2 (Light Harvesting complex 2, from purple bacteria)) between the electrodes. Methods are described for supplying power to a circuit comprising exposing a photovoltaic device of the present invention to light. Electronic devices are described which incorporate solid state photosensitive devices of the present invention.

BACKGROUND OF THE INVENTION

Photosynthesis is the biological process that converts electromagnetic energy into electrochemical energy through light and dark reactions. Photosynthesis occurs in specialized organelles in green algae and higher plants called chloroplasts. The chloroplast is enclosed by a double membrane and contains thylakoids, consisting of stacked membrane disks (grana) and unstacked membrane disks (stroma). The thylakoid membrane contains two key photosynthetic components, photosystem I and photosystem II, designated PSI and PSII, respectively.

Electrical studies of photosynthetic complexes were pioneered by Lee and Greenbaum at Oak Ridge National Lab. Lee, I., et al., *Phys. Rev. Lett.* 79, 3294 (1997); Greenbaum, E., *Science* 230, 1373 (1985); Lee, I., et al., *J. Phys. Chem. B* 104, 2439 (2000). These workers have chemically precipitated Pt onto the electron donating site on the surface of a complex and then used the platinized complex to generate $H_2$. They have also measured the orientation statistics of complexes on hydrophilic substrates and observed a photovoltage using Kelvin force microscopy. Greenbaum, E., Bioelectrochemistry and Bioenergetics, 21:171, 1989; Greenbaum, E., J. Phys. Chem., 94:6151, 1990; Lee, I., Proc. Natl. Acad. Sci. USA, 92:1965, 1995; Lee, I., et al., 11(4):375, 1996. See, also, U.S. Pat. No. 6,162,278, entitled Photobiomolecular Deposition of Metallic Particles and Films, Hu, Dec. 19, 2000.

Fabrication of molecular circuits is presently beyond the resolution of conventional patterning techniques such as electron beam lithography. However, positioning of molecules with sub nanometer precision is routine in nature, and crucial to the operation of photosynthetic complexes. Photosynthetic complexes, for example, are optimized to funnel energy from a molecular antenna to a reaction center where charge is generated. Natural protein scaffolds control the exact placement and orientation of optically and electronically active molecular components. Photosynthetic complexes possess a combination of size and functionality that has been optimized by evolution. In a typical complex such as that found in the purple bacterium *Synechococcus Elongatus*, absorbed photons are harvested within 100 ps of the absorption of a photon with an overall quantum yield of 98%. Photovoltages of 1 V are generated across the complex and the power conversion efficiency is approximately 40%. Schubert, W. D., et al., *J. Mol. Biol.* 272, 741-768 (1997). Indeed, natural biomolecular complexes exceed the efficiencies of even the best artificial photovoltaic devices.

The prior art, however, has failed to describe a high efficiency photoconversion structure for trapping and converting incident light to electrical energy suitable for nanometric electronic devices. A need in the art remains for solid state photosensitive devices which interface protein-based molecular components of photosynthesis with conventional electronics including photovoltaic devices which convert light into photocurrent and thereby supply electrical power to a circuit.

Accordingly, a key object of the invention described herein is the solid state incorporation of light harvesting complexes into functional devices including devices which employ single photosynthetic complexes.[1]

[1] The prior art also fails to contemplate organic layers incorporated into a solid state photosensitive device comprised of a Light Harvesting Complex as described herein.

SUMMARY OF THE INVENTION

Solid state photosensitive devices are provided which comprise a first electrode (2) and a second electrode (4) in superposed relation; and at least one isolated Light Harvesting Complex (LHC) (6) between the electrodes.

Photosensitive devices are provided which further comprise an electron transport layer (8) formed of a first photoconductive organic semiconductor material, adjacent to the LHC (6), disposed between the first electrode (2) and the LHC (6); and a hole transport layer (10) formed of a second photoconductive organic semiconductor material, adjacent to the LHC (6), disposed between the second electrode (4) and the LHC (6).

Alternate embodiments of the present invention comprise at least one additional layer of photoconductive organic semiconductor material (12), disposed between the first electrode (2) and the electron transport layer (8) and/or at least one additional layer of photoconductive organic semiconductor material (14), disposed between the second electrode (4) and the hole transport layer (10).

Embodiments of the invention are provided wherein an electron and/or exciton blocking layer (16) is disposed between the second electrode (4) and the hole transport layer (10).

Solid state photosensitive devices of the present invention are preferred wherein the first electrode (2) is substantially transparent to incident light (λ~800 nm), photoconductive organic semiconductor material between the electrodes (2) (4) is substantially transparent to incident light, and wherein the second electrode (4) is substantially reflective of incident light.

Embodiments of the invention are provided wherein the distance between the LHC and each electrode (18) is about λ/4n wherein λ is the peak wavelength of light absorbed by the LHC and n is the refractive index of the material between the LHC and each electrode ((2) or (4)).

Solid state photosensitive devices are preferred wherein the first electrode (2) is further connected to the second electrode (4) by means of a circuit (20).

Methods of generating photocurrent are provided which comprise exposing a photovoltaic device of the present invention to light.

Electronic devices are provided which incorporate at least one solid state photosensitive device of the present invention.

BRIEF DESCRIPTION OF THE FIGURES

FIG. 3A shows a schematic embodiment of the present invention.

FIG. 3B shows a schematic diagram of several complexes of LHC sandwiched between silver and transparent indium tin oxide (photovoltaic device).

FIGS. 4A-4C illustrate the production of photocurrent by means of an example solid state photosensitive device of the present invention.

FIG. 6 illustrates the extension of a LHC-based molecular sensor to a molecular switch.

DETAILED DESCRIPTION OF THE INVENTION

Unless defined otherwise, all technical and scientific terms used herein have the same meaning as is commonly understood by one of skill in the art to which this invention belongs. All publications and patents referred to herein are incorporated by reference.

It is a general object of the present invention to provide a high efficiency photoconversion structure for trapping and converting incident light to electrical energy. The present invention particularly relates to solid state photosensitive devices comprising a first electrode and a second electrode, in superposed relation, and at least one isolated Light Harvesting Complex (LHC) between the electrodes. Photosensitive devices of the present invention include photovoltaic devices which convert light into photocurrent and thereby supply electrical power to a circuit. The invention is drawn toward a wide variety of embodiments which interface protein-based molecular components of photosynthesis with conventional electronics. The invention is particularly suitable for nanometer scale photosensitive devices including sensors, photovoltaic cells and devices related thereto. A key object of the invention is the incorporation of light harvesting complexes into functional devices including devices which employ single photosynthetic complexes. Nanometer-scale photodetectors and photovoltaic cells are provided for nanometric devices.

Figure 1:
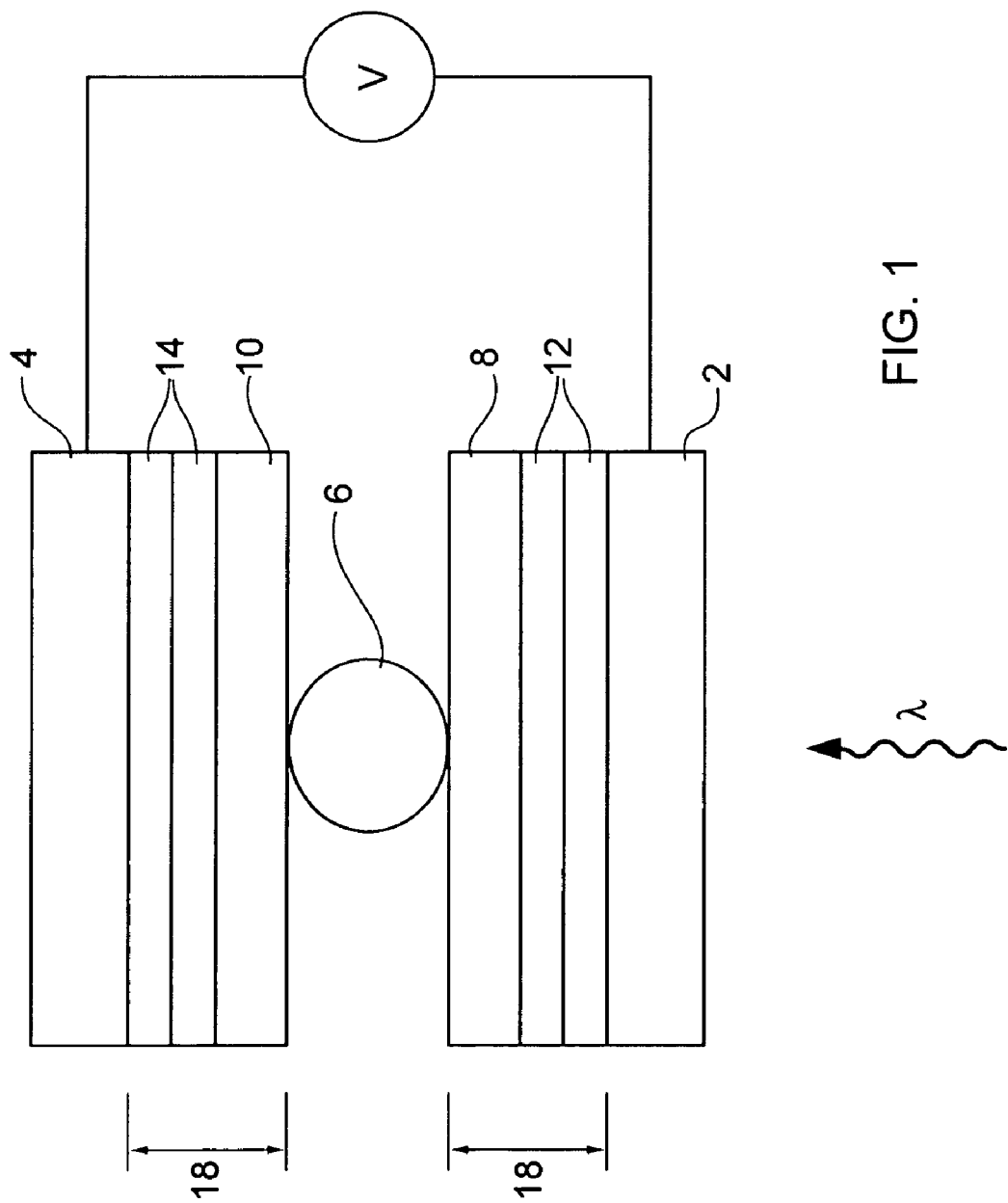
FIG. 1 displays an example solid state photosensitive device of the present invention.

With regard to FIG. 1, solid state photosensitive devices of the current invention are particularly comprised of a first electrode (2) and a second electrode (4) in superposed relation; and at least one isolated LHC (6) between the electrodes. Embodiments of the invention may further comprise, for example, an electron transport layer (8) formed of a first photoconductive organic semiconductor material, adjacent to the LHC (6), disposed between the first electrode (2) and the LHC (6); and a hole transport layer (10) formed of a second photoconductive organic semiconductor material, adjacent to the LHC (6), disposed between the second electrode (4) and the LHC (6). Alternate embodiments of the present invention comprise at least one additional layer of photoconductive organic semiconductor material (12), disposed between the first electrode (2) and the electron transport layer (8) and/or at least one additional layer of photoconductive organic semiconductor material (14), disposed between the second electrode (4) and the hole transport layer (10).

Figure 2:
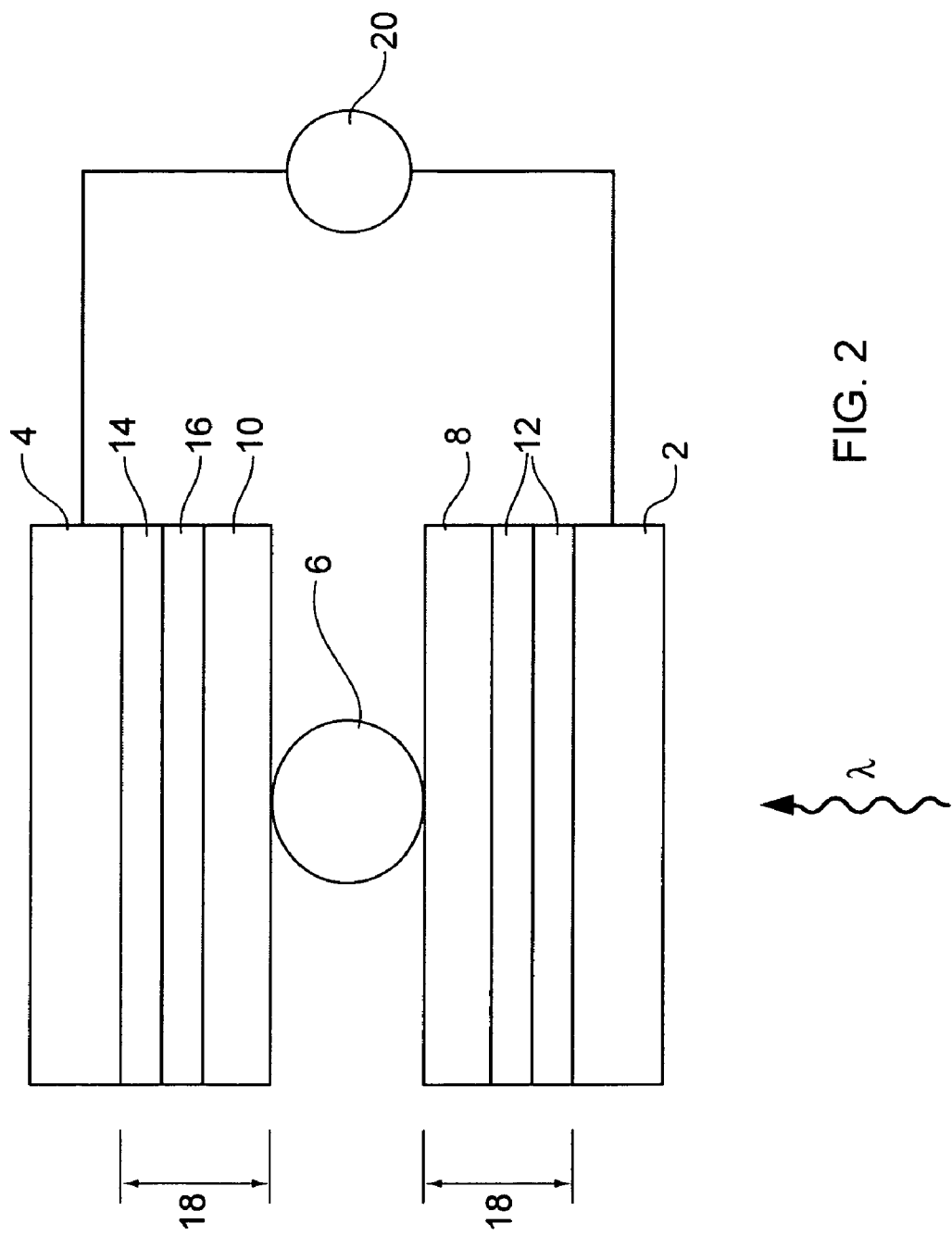
FIG. 2 illustrates an alternate solid state photosensitive device of the present invention.

With regard to FIG. 2, embodiments of the invention are provided wherein an exciton blocking layer (16) is disposed between the second electrode (4) and the hole transport layer (10). Solid state photosensitive devices of the present invention are preferred wherein the first electrode (2) is substantially transparent to incident light (λ~800 nm), photoconductive organic semiconductor material between the electrodes is substantially transparent to incident light, and wherein the second electrode (4) is substantially reflective of incident light. Embodiments of the invention are provided wherein the distance (18) between the LHC and each electrode is about λ/4n wherein λ is the peak wavelength of light absorbed by the LHC and n is the refractive index of the material between the LHC and each electrode. Solid state photosensitive devices are preferred wherein the first electrode (2) is further connected to the second electrode (4) by means of a circuit (20).

Evolutionary optimization of photosynthetic complexes is particularly exploited to provide efficient power conversion. LHCs position reagents of photosynthesis with sub-nanometer precision and provide biomolecular electronic components in the solid state photosensitive devices of the present invention. Precisely positioned molecules in LHC components of the present invention interact via dipole-dipole coupling (like an antenna and receiver). This coupling is very sensitive to molecular positions and orientations. The ultrasmall scale lowers switching energies and transit times. The term "LIGHT HARVESTING COMPLEX" (LHC) as used herein refers to photosynthetic complexes, e.g., PSI (Photosystem I, from spinach, for example), and/or LH2 (Light Harvesting complex 2, from purple bacteria). Fromme, P., et al., *Biochim. Biophys. Acta* 1365, 175 (1998); Lee, I., et al., *Phys. Rev. Lett.* 79, 3294 (1997); Schubert, W. D., et al., *J. Mol. Biol.* 272, 741-768 (1997). These complexes are available commercially, for example, from PROTEIN LABS Inc., 1425 Russ Blvd., Suite T-107C, San Diego, Calif. 92101. Photosystem I (PSI), for example, is a preferred LHC in the construction of solid state photosensitive devices of the present invention including logic devices. PSI, for example, used in accordance with the present invention will preferably be prepared, for example, from spinach chloroplasts. PSI is a protein-chlorophyll complex that has diodic properties and is part of the photosynthetic machinery within the thylakoid membrane. It is ellipsoidal in shape and has dimensions of about 5 by 6 nanometers. PSI is employed herein to create nanometer circuits. The PSI reaction center/core antenna complex contains about 40 chlorophylls per photoactive reaction center pigment (P700). The chlorophyll molecules serve as antennae which absorb photons and transfer the photon energy to P700, where this energy is captured and utilized to drive photochemical reactions. In addition to the P700 and the antenna chlorophylls, the PSI complex contains a number of electron acceptors. An electron released from P700 is transferred to a terminal acceptor at the reducing end of PSI through intermediate acceptors, and the electron is transported across the thylakoid membrane. An electron is transferred to the stroma surface and the hole remains on the lumen surface of PSI. After absorption of a photon, the energy is channeled to the primary electron donor at the base of the complex. Following exciton dissociation, the electron is transferred through three $Fe_4S_4$ clusters to the opposite surface. The result is an electron on the upper (stroma) surface and a hole on the lower (lumen) surface. Accordingly, due to the directed nature of electron transfer, it is preferred that the complexes possess the correct orientation when deposited on a substrate. The work of Lee, et al., determined that PSI complexes preferentially deposit on hydrophilic surfaces with the electron transport vector perpendicular to the substrate. *Phys. Rev. Lett.* 79, 3294-3297 (1997).

For the PSI reaction center, the midpoint oxidization potential generated by the primary electron donor (P700) is about +0.4 V and the corresponding reduction potential generated by the electron acceptor (4Fe-4S center) is about −0.7 V. The PSI reaction center, therefore, is a photodiode (unidirectional electron flow) and nanometer-sized (about 6 nm) solar battery.

Another important complex is the LHC used by purple bacteria (*Rhodopseudomanas acidophila*) to absorb radiant solar energy. This has also been isolated and crystallized. Cogdell, R. J., et al., *Biochimica et Biophysica Acta* 722, 427-435 (1984); McDermott, G., et al., *Nature* 374, 517-521 (1995); Papiz, M. Z., et al., *Journal of Molecular Biology* 209, 833-835 (1989); Fenna, R. E., et al., *Nature* 258, 573-577 (1975). The photosynthetic machinery of this bacterium is biologically optimized to funnel energy to the reaction center within 100 ps with an overall quantum yield of 98%. Sundstrom, V., et al., *Journal of Physical Chemistry B* 103, 2327-2346 (1999); Renger, T., et al., *Physics Reports* 343, 137-254 (2001). The protein serves several purposes. It gives the photosynthetic unit its rigidity, fixes the pigments at their positions, and provides a heat sink for excess energy. Photosynthetic units have also evolved with protection against degradation, for example, one pigment known as a carotenoid significantly increases the stability of the photosynthetic unit by quenching triplet states (preventing the possible formation of reactive singlet oxygen via triplet-triplet annihilation). Photosynthetic complexes such as these may be employed as components of photodetectors and photo-voltaic cells described herein.

The well-characterized biomolecular complex Photosystem I (PSI) originating from the purple bacterium *Synechoccus Elongatus* is another example of LHC for employment in solid state photosensitive devices of the current invention. Schubert, W. D., et al., *J. Mol. Biol.* 272, 741-768 (1997). PSI preferentially forms trimers. Charge generation occurs at the reaction center in the center of each PSI monomer. Approximately 100 chlorophyll molecules surround the reaction center. These molecules absorb light and channel it to the center, acting as a highly efficient antenna. There are also 15-25 carotenoid molecules that absorb light at wavelengths where the chlorophyll molecules possess low sensitivity. The carotenoids protect the structure against oxidation by quenching the formation of singlet oxygen. PSI may exist on its own or in combination with additional light harvesting complexes, thereby enhancing its absorption under low light levels.

Since the LHC reaction center is a pigment-protein complex that is responsible for the photosynthetic conversion of light energy to electronic energy, these reaction centers are now employed as described herein as a component in a variety of different devices.

The present invention provides a solid state photosensitive device comprising at least one isolated LHC connected electronically to a first electrode and independently connected electronically to a second electrode. Also provided is a solid state photovoltaic device comprising at least one isolated LHC connected electronically to a first electrode and independently connected electronically to a second electrode and wherein the first electrode is further connected to the second electrode by means of a circuit. Solid state photosensitive devices of the present invention comprise a first electrode and a second electrode in superposed relation; and at least one isolated LHC between the electrodes. The present system provides a photosynthetic system, which employs light-harvesting and charge separation processes in photosynthesis but also acts as an efficient light-to-current converter in molecular devices.

The electrodes, or contacts, used in the solid state photosensitive devices of the present invention are an important consideration. It is desirable to allow the maximum amount of ambient electromagnetic radiation from the device exterior to be admitted to the photoconductively active interior region. That is, it is desirable to get the electromagnetic radiation to where it can be converted to electricity by photoconductive absorption. This often dictates that at least one of the electrical contacts should be minimally absorbing and minimally reflecting of the incident electromagnetic radiation. That is, such contact should be substantially transparent. When used herein, the terms "electrode" and "contact" refer only to layers that provide a medium for delivering photogenerated power to an external circuit or providing a bias voltage to the device. That is, an electrode, or contact, provides the interface between the photoconductively active regions of a solid state photosensitive device and a wire, lead, trace or other means for transporting the charge carriers to or from the external circuit. The term "charge transfer layer" is used herein to refer to layers similar to but different from electrodes in that a charge transfer layer only delivers charge carriers from one subsection of the device to the adjacent subsection. As used herein, an organic layer of material or a sequence of several layers of different materials is said to be "transparent" when the layer or layers permit at least 50% of the ambient electromagnetic radiation in relevant wavelengths to be transmitted through the layer or layers. Similarly, layers which permit some but less that 50% transmission of ambient electromagnetic radiation in relevant wavelengths are said to be "semitransparent".

Electrodes or contacts are usually metals or "metal substitutes". Herein the term "metal" is used to embrace both materials composed of an elementally pure metal, e.g., Mg, and also metal alloys, which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV rendering it transparent to wavelengths greater than approximately 3900 angstroms. Another suitable metal substitute material is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that may be thought of as a type of chemical bonding that results from a sea of valence electrons which are free to move in an electronic conduction band throughout the metal lattice. While metal substitutes may contain metal constituents, they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

THE FIRST ELECTRODE is preferably substantially transparent to incident light ($\lambda$~800 nm, for example). The first electrode can be comprised of, for example, indium tin oxide (ITO) or degenerately doped ITO. Other materials suitable for this purpose include but are not limited to, for example, ZnO, $TiO_2$, Ag (silver), Au (gold), and Pt (platinum).

THE SECOND ELECTRODE is preferably substantially reflective to incident light ($\lambda$~800 nm, for example). The reflective electrode may be comprised of, for example, a metallic film such as Al (aluminum), Ag (silver), or Au (gold), In, Mg, Mg:Ag (~1:10 ratio), Ca, or a stack (layered) 0.5 nm LiF/100 nm Al.

The term organic layer or "layer", as used herein, refers to photoconductive organic semiconductor material. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation of selected spectral energies to generate electric charge carriers.

Photosensitive devices of the invention may further comprise an ELECTRON TRANSPORT LAYER formed of a first photoconductive organic [layer] semiconductor material, adjacent to the LHC, disposed between the first electrode and the LHC; and/or a HOLE TRANSPORT LAYER formed of a second photoconductive organic semiconductor material, adjacent to the LHC, disposed between the second electrode and the LHC.

An electron transport layer may be formed of a photoconductive organic semiconductor, e.g., 3,4,9,10-perylenetetracarboxylic-bis-benzimidazole (PTCBI). Other materials which have the general ability to extract electrons and/or have a high affinity for electrons, for this purpose, include but are not limited to, for example, BCP, $Alq_3$, CBP, $F_{16}CuPc$, $C_{60}$, PTCBI, and PTCDA.

A hole transport layer may be formed of a second photoconductive organic semiconductor, e.g., copper phthalocyanine (CuPc). Other materials which have the general ability to donate electrons and/or a low ionization potential for this purpose, include but are not limited to, for example, $\alpha$NPD, TPD, CuPc, CoPc, and ZnPc.

One or more additional layers (up to about 5 (five) layers) of photoconductive organic semiconductor material may be disposed between the first electrode and the electron transport layer in the solid state photosensitive devices of the present invention. Similarly, one or more additional layers (up to about 5 (five) layers) of photoconductive organic semiconductor material may be disposed between the second electrode and the hole transport layer. Functions of these layers include, but are not limited to, spacer layers (for optical interference optimization), blocking layers and multiplication layers.

Embodiments of solid state photosensitive devices described herein are preferred wherein the distance between the LHC and each electrode is about $\lambda/4n$ wherein n is the refractive index of the material between the LHC and each electrode (n typically ~1.7).

Further embodiments of solid state photosensitive devices of the present invention comprise, in addition to the hole transport layer adjacent to the LHC disposed between the second electrode and the LHC, an EXCITON BLOCKING LAYER of photoconductive organic semiconductor material, disposed between the second electrode and the hole transport layer. Examples of exciton blocking layer materials include, but are not limited to, 2,9-dimethyl-4,7-diphenyl-1,10-phenanthroline (BCP); 4,4',4"-tris{N,-(3-methylphenyl)-N-phenylamino}triphenylamine (m-MTDATA); and polyethylene dioxythiophene (PEDOT). See, Forrest, et al., U.S. Pat. No. 6,451,415, entitled Organic Photosensitive Optoelectronic Device with an Exciton Blocking Layer.

Further embodiments of the solid state photosensitive device are contemplated wherein the first electrode has an aperture for admittance of light to the LHC. Solid state photosensitive devices of the invention may employ an optical concentrator for admittance of light to the LHC. A structure designed to trap light within may generally be called a waveguide structure, or also an optical cavity or reflective cavity. The optical recycling possible within such optical cavities or waveguide structures is particularly advantageous in devices utilizing organic photosensitive materials since much thinner photoactive layers may be used without sacrificing conversion efficiency. Admitted light is trapped and recycled through the contained photosensitive materials to maximize photoabsorption. It is an object of this feature to increase the collection of light and to provide a high efficiency photoconversion structure for trapping and converting incident light to electrical energy. It is a further object to provide a high efficiency photoconversion structure utilizing generally conical parabolic optical concentrators. It is a further object to provide a high efficiency photoconversion structure utilizing generally trough-shaped parabolic optical concentrators. It is a further object to provide a high efficiency photoconversion structure having an array of optical concentrators and waveguide structures with interior and exterior surfaces of the concentrators serving to concentrate then recycle captured radiation. See, Forrest, et al., U.S. Pat. No. 6,333,458, entitled Highly Efficient Multiple Reflection Photosensitive Optoelectronic Device With Optical Concentrator.

Figure 5:
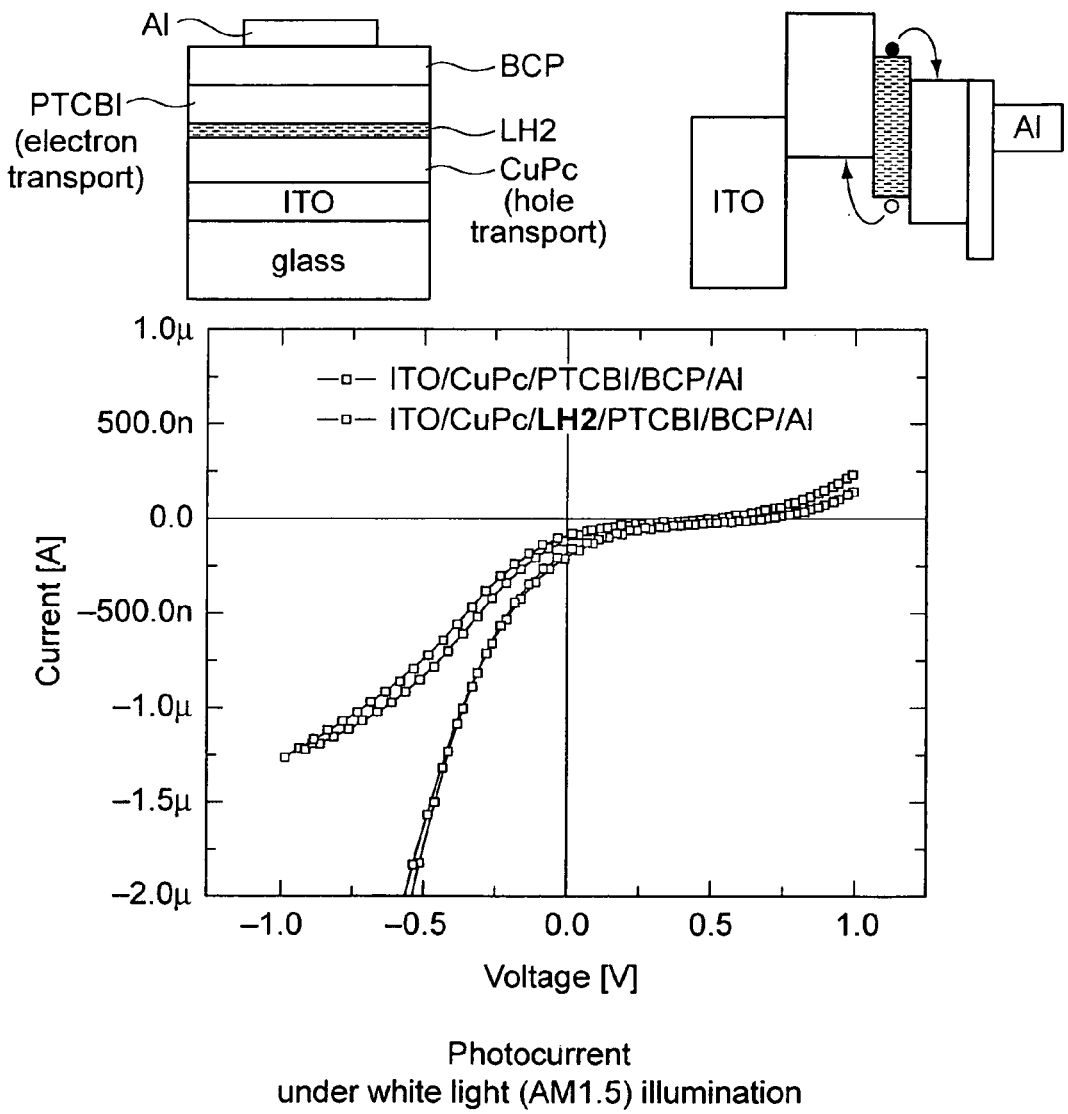
FIG. 5 illustrates the production of photocurrent by means of another example solid state photosensitive device of the present invention.

The term CIRCUIT as used herein has its ordinary meaning and thereby refers to any circuit including capacitors and circuits which comprise a load or external load. The circuit may have external voltage applied. Photovoltaic devices of the present invention have the property that, when they are connected across a load and are irradiated by light, photogenerated voltage and/or photocurrent is produced. FIG. 4 and FIG. 5, for example, demonstrate the production of photocurrent by means of example solid state photosensitive devices of the present invention.

SOLID STATE PHOTOSENSITIVE DEVICES of the present invention convert light into electricity. Devices of the present invention include, for example, optical components, switches, sensors, logic gates, and energy sources. Solid state photovoltaic (PV) devices are specifically provided to generate electrical power. These devices are employed to drive power consuming loads. Electronic equipment such as computers or remote monitoring or communications equipment may be operated by means of solid state photosensitive devices of the present invention. Many applications of nanoscale circuits, for example, may require distributed power supplies and photodetectors. The small size of molecular complexes makes them ideal for purposes, architectures, and functionalities based on these materials. These power generation applications may further involve energy storage devices so that operation may occur or continue when direct illumination from the sun or other ambient light sources is not available. Solid state photosensitive devices or devices which incorporate photosensitive devices of the present invention include, but are not limited to, light powered molecular circuitry, solar batteries, optical computing and logic gates, optoelectronic switches, electronic photo-sensors to sense light, chemicals, toxins, pathogens and therapeutic agents, for example, and photonic A/D converters. Photosensitive devices of the present invention may be employed as local energy sources for nanoscale systems, e.g., processing elements. Photovoltaic cells of the invention, for example, may be as small as 10 nm in diameter.

Photosensitive devices of the invention may be incorporated into sensor devices for the detection of conditions, agents, and/or biological entities such as bacteria and viruses. Photosynthetic complexes are compatible with biological and chemical systems, and photovoltaic energy sources can function in SENSING APPLICATIONS. Sensors, for example, may employ biological or chemical methods evolved or designed to sensitively detect biological or chemical agents. The response may be a change in current, voltage, capacitance, inductance, light output, for example, or absorbance. Presence of an analyte (substance to be detected) switches on or off the photoresponse or change the absorption or emission spectrum. The natural link between these sensors and the architecture of complexes such as the photosynthetic complexes is exploited in this manner.

The extension of a LHC-based molecular sensor to a MOLECULAR SWITCH is shown in FIG. 6. The architecture of LHC-based molecular sensors and logic elements. In both cases, energy is provided optically. This architecture forms the basis of a wireless computer, where signals are carried by molecular triggers. For logic operation, the output of a single LHC unit should be the input for another LHC. This requires that either the photosynthetic unit be used to generate molecular triggers or the LHC must be quenched by an electrical signal. LHCs are employed to generate a molecular trigger that is passed from one photosynthetic unit to the next, forming the basis of 'wireless' computing.

EXAMPLES

When depositing metal contacts onto the Light Harvesting Complexes (LHC), care must be taken not to disturb the protein scaffold of the LHC. For this purpose, for example, non-destructive nanometric metal contact stamping techniques are employed. The protein-based complex is interfaced with conventional electronics using a nanopatterning technique. See, e.g., Kim, et al., U.S. Pat. No. 6,468,819, Method For Patterning Organic Thin Film Devices Using A Die; and, Lee, et al., Programmable Nanometer-Scdale Electrolytic Metal Deposition And Depletion, U.S. Pat. No. 6,447,663, each of which is herein incorporated by reference.

Example I

Figure 7:
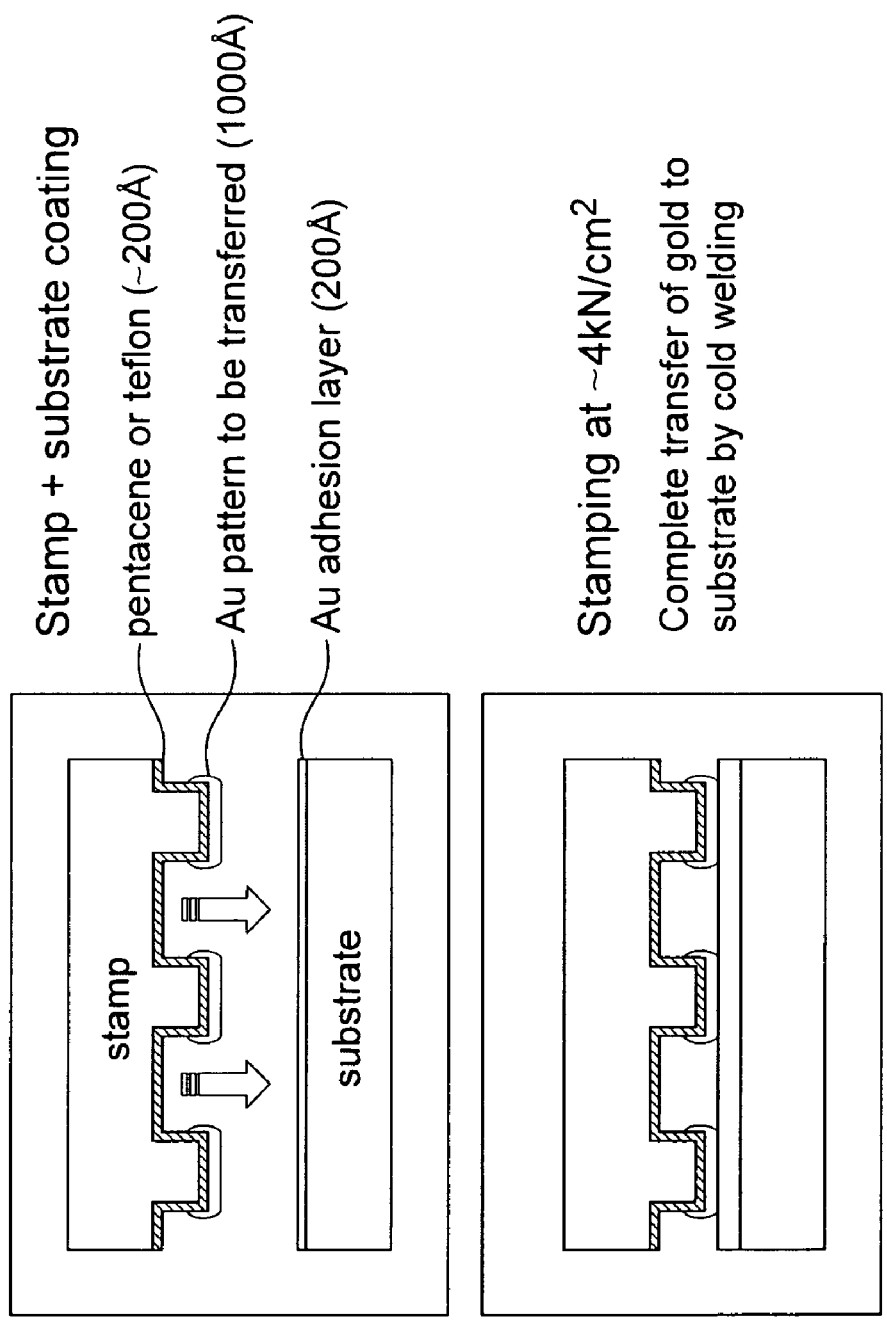
FIG. 7 illustrates an embodiment of an ultrahigh resolution, non-damaging stamping process by which metal contacts are directly transferred to the LHC.
Figure 8:
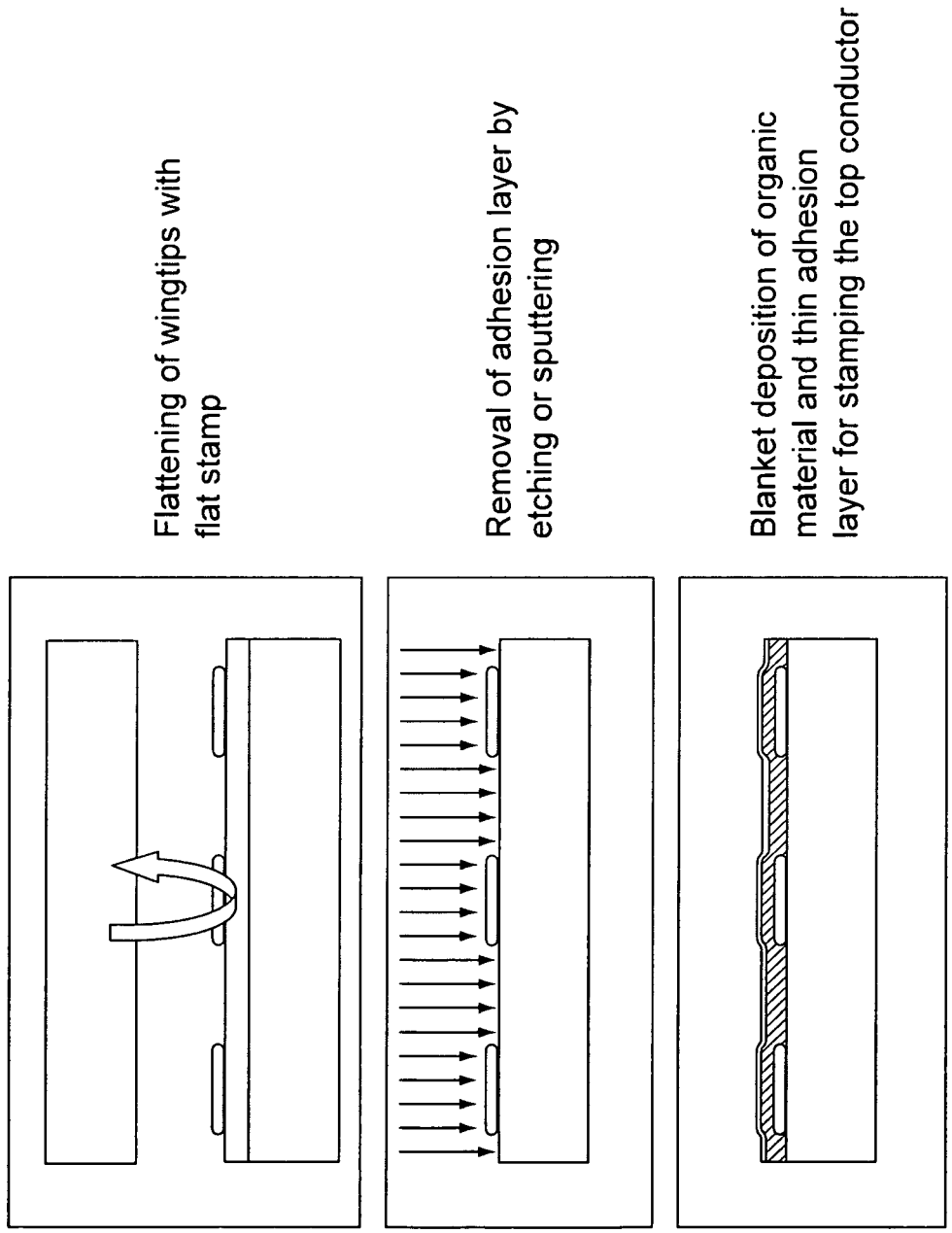
FIG. 8 illustrates a step of an ultrahigh resolution, non-damaging stamping process by which metal contacts are directly transferred to the LHC.
Figure 9:
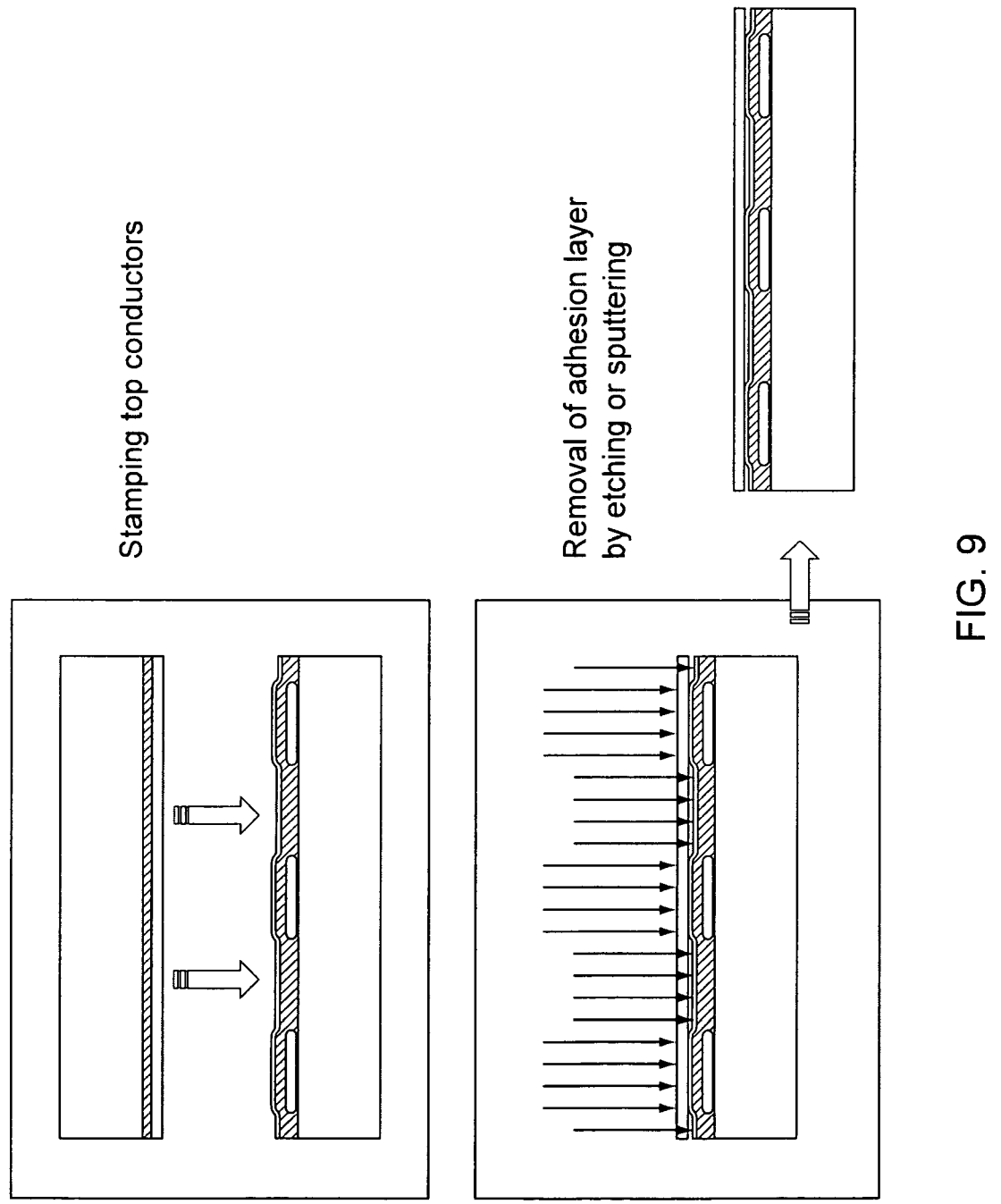
FIG. 9 illustrates another step of an ultrahigh resolution, non-damaging stamping process by which metal contacts are directly transferred to the LHC.

The devices may be constructed ("grown") from one side. For example, an electrode may first be deposited on a substrate (e.g., glass or plastic). PSI complexes, for example, may be deposited on a transparent indium tin oxide electrode. Metal contacts to the LHC, a PSI complex, for example, may be directly transferred by the ultrahigh resolution, non-damaging stamping process. The formation of metal contacts must be compatible with fragile protein (LHC) complexes. The aim of the technique is the transfer of a metal film at the points of contact between a lithographically patterned stamp and a substrate at resolutions comparable to the diameter of the PSI complexes (about 10 nm). Transfer occurs if the substrate-metal adhesion exceeds adhesion forces between the stamp and the metal layer. To improve transfer, one or more adhesion reduction layers, such as Teflon®, may be deposited between the stamp surface and the metal layer. See FIG. 7 (FIG. 7-9). Prior to step 1, a thin layer (<50?) of metal is deposited on the substrate using vacuum evaporation or sputtering. This 'strike' layer is sufficiently thin to minimize damage to any delicate features of the substrate. In step 1, a metal coated stamp is brought in contact with the strike layer. Metal is transferred at the points of contact. Transfer may be enhanced by inserting an adhesion reduction layer between the stamp and its metal coating, and possibly eliminating the strike layer. After removal of the stamp in step 2, the patterned substrate is etched in step 3 and any exposed strike material is removed by Ar sputtering. See, U.S. Pat. No. 6,468,819, Method For Patterning Organic Thin Film Devices Using A Die; and, Lee, et al., Programmable Nanometer-Scdale Electrolytic Metal Deposition And Depletion, U.S. Pat. No. 6,447,663. Although in this Example metal deposition is basically the first step (electrode) metal deposition of the electrode(s) may be the final step(s) of the construction process. The term "electrode" as used herein is generic for "first electrode" or "second electrode" as used in the claims appended hereto.

Example II

The electrode may be patterned, e.g., lithography. However, patterning may be simultaneously accomplished with the electrode deposition as in I. FIG. 3 shows a schematic diagram of several complexes of LHC sandwiched between silver and transparent indium tin oxide (photovoltaic device). The TIO may be patterned by exposing a self assembled LHC monolayer using electron beam lithography, thereby changing the surface adhesion properties of the LHC complex. The dimensions of the stamped contacts are defined by electron beam lithography. Electron-beam lithography to define raised features on a stamp is well known to people in the art. It involves exposing a resist (polymer, typically PMMA—polymethyl methacrylate) to a fine (~1 nm) electron beam. Where the resist is exposed, it will dissolve in a weak solvent that leaves the unexposed parts untouched. The resist pattern is then transferred into the stamp material by wet or dry etching techniques.

Example III 1-5 organic layers, for example, may be added by thermal evaporation, for example, on top of the electrode. The LHC may be sandwiched between thin film organic charge transport materials. Because LHC require solution processing, the supporting organic layer adjacent to the LHC is preferably a hydrophobic charge transporting polymer (e.g. PPV (Poly-(phenylene vinylene)) or PEDOT:PSS (poly ethylene dioxythiophene:polystyrene-sulfonate)). An overlayer adjacent to the LHC may be fabricated from a vacuum deposited small molecular material to eliminate solvent conflicts with the underlying polymer and the LHC. Organic layers are preferably transparent to incident light. Hence the photovoltaic action of the heterostructure to visible light in the absence of the LHC is negligible. Individual active optical molecules are contacted, for example, using organic thin films. Organic films of one to several (e.g., 5 (five)) molecular layers can be grown, for example, using vacuum techniques. S. R. Forrest, Chem. Rev. vol. 97, p. 1793 (1997).

Example IV

At least one LHC, e.g., PSI or LH2, is deposited onto the top organic layer.

A system for controlling electrodeposition of a deposition entity (e.g., light harvesting complex) preferably includes two electrodes in superposed relation. Entities having weak or non-existent polarity or induceable polarity under electrodeposition conditions can be covalently linked to an appropriate charged carrier to form a charged complex that can be deposited on an electrode. The solution or suspension of deposition entity can be an aqueous solution, such as physiological saline, capable of conducting a substantial electrical current. The direction, rate of migration, and rate of deposition of the deposition entity originally in solution or suspension of deposition can be controlled with great sensitivity by appropriately adjusting the pH of the solution. The pH of the solution or suspension is adjusted to greater than or less than the isoelectric point of the deposition entity to be deposited. This adjustment can be accomplished using known acids or alkaline agents as desired. Other additives, such as non-ionic surfactants and anti-foaming agents or detergents can also be added to the solution as desired. Electrodes can be formed of metals or "metal substitutes", for example, attached to substrates. Substrates can be either organic or inorganic, biological or non-biological, or any combination of these materials. Suitable materials for substrates include silicon, silica, quartz, glass, controlled pore glass, carbon, alumina, titanium dioxide, germanium, silicon nitride, zeolites, and gallium arsenide. The term "metal" is used to embrace both materials composed of an elementally pure metal, such as Ag or Mg, and also metal alloys which are materials composed of two or more elementally pure metals, e.g., Mg and Ag together, denoted Mg:Ag. The term "metal substitute" refers to a material that is not a metal within the normal definition, but which has the metal-like properties that are desired in certain appropriate applications. Suitable metal substitutes which can be used for electrodes include doped wide bandgap semiconductors, for example, transparent conducting oxides such as indium tin oxide (ITO), gallium indium tin oxide (GITO), and zinc indium tin oxide (ZITO). Other suitable materials for electrodes are polymeric metals such as poly-ehtylene-dioxythiophene (PEDOT) doped with poly-styrenesulfonate (PSS). A power supply having a positive lead connected to one of the electrodes and a negative lead connected to the other electrode is provided to supply substantially constant current flow between the electrodes. Distance $D_1$ between the electrodes can be in the range of about 10 nm to about 5.0 mm. Deposition on nanoscale electrodes can occur provided the remaining area of the substrate is insulated. A suitable distance $D_1$ is about 1.0 mm. The voltage applied to the electrodes is dependent on the distance $D_1$. For example, the voltage applied can be in the range of about 1 V/cm to about 1,000 V/cm. A suitable voltage range of about 10 V/cm to about 200 V/cm can be used with a distance between the electrodes of about 1 mm. A solution or suspension of deposition entity is provided between the electrodes. The voltage is continuously applied for a predetermined time to effect migration of deposition entity toward one of the electrodes to provide deposition of a film of deposition entity. For example, voltage can be continuously applied for about 5 minutes to about 48 hours. The voltages applied are based on the desired thickness of a film of deposition entity, and on the concentration of the solution from which deposition entity is electrodeposited. It has been found desirable to use the smallest distance between the electrodes in order to decrease the required voltage. The concentration of the deposition entity in solution or suspension of deposition entity and the volume of the solution is selected to control the thickness of a film of deposition entity that is deposited upon continuous application of a predetermined voltage. The concentration of the deposition entity in solution or suspension can be selected to form a monolayer on one of the electrodes. In one embodiment of the present invention, 100% of the deposition entity can be deposited on an electrode using a concentration of the deposition entity in the range of about 10 µ/g/ml to about 1 mg/ml, a volume of about 1 mm$^3$ to about 100 mm$^3$ with a voltage in the range of about 10 V/cm to about 200 V/cm resulting in a film of a monolayer having a thickness of about 5 nm to about 10 nm. It will be appreciated that thicker films can be deposited by varying the concentration of deposition entity in solution or suspension and the volume of the solution. A retainer housing can have a size selected to provide a predetermined volume of solution or suspension of deposition entity. For example, retainer housing can have a size to provide a volume of about 1 mm$^3$ to about 100 mm$^3$. Migration of the deposition entity occurs towards the electrode charged in the opposite sense to the charge of the deposition entity. Deposition entity can be attached to the electrode largely due to van der Waals interactions between the deposition entity and the electrode. Immobilized entities can be used in any device in which the immobilized entity is essential to operation of the device. Suitable devices include solid state devices, memory devices and photo voltaic devices.

A monolayer of the LHC can be deposited, for example, using conventional spinning techniques in the aqueous solution.

Functional orientation of the LHC is important because light stimulation produces an electron on the upper (stroma) surface and a hole on the lower (lumen) surface of the LHC. Accordingly, the LHC must be in proper orientation (which depends upon the intended application) when deposited on the substrate. This can be accomplished by electrostatic deposition since both sides will have different charge densities or even different charge polarities. Other possibilities are affinity or covalent binding to specific groups on the protein (these groups can be naturally present or are inserted by recombinant DNA techniques). U.S. Pat. No. 6,231,983, Method of Orienting Molecular Electronic Components, Lee, et al., May 15, 2001, for example, is directed to methods of orienting PSI reaction centers on a substrate. The methods include the chemical modification of a surface of the substrate such that the surface of the substrate is capable of immobilizing a PSI reaction center in a preselected orientation. Then, a solution containing the PSI reaction centers is added and the PSI are oriented in the preselected orientation. The preselected orientation may be parallel to the surface of the substrate, perpendicular to the surface in the "up" position, or perpendicular to the surface in the "down" position. The determination of the preselected orientation should be based upon the desired use of the substrate.

Example V

Organic layers may be added by thermal evaporation, as in III, for example, on top of the deposited light harvesting complex.

Example VI

The top electrode may be added, for example, by nanometric stamping process as in I.

All publications and patents mentioned in the above specification are herein incorporated by reference. Various modifications and variations of the described compositions and methods of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described compositions and modes for carrying out the invention which are obvious to those skilled in the art or related fields are intended to be within the scope of the following claims.

What is claimed is:

1. A solid state photosensitive device comprising:
   a first electrode and a second electrode in superposed relation;
   at least one isolated Light Harvesting Complex (LHC) between the electrodes;
   an electron transport layer formed of a first photoconductive organic semiconductor material, adjacent to the LHC, disposed between the first electrode and the LHC; and
   a hole transport layer formed of a second photoconductive organic semiconductor material, adjacent to the LHC, disposed between the second electrode and the LHC.

2. A solid state photosensitive device according to claim 1 further comprising:
   at least one additional layer of photoconductive organic semiconductor material, disposed between the first electrode and the electron transport layer.

3. A solid state photosensitive device according to claim 1 further comprising:
   at least one additional layer of photoconductive organic semiconductor material, disposed between the second electrode and the hole transport layer.

4. A solid state photosensitive device according to claim 2 further comprising:
   at least one additional layer of photoconductive organic semiconductor material, disposed between the second electrode and the hole transport layer.

5. A solid state photosensitive device according to claim 3 wherein a layer of photoconductive organic semiconductor material, disposed between the second electrode and the hole transport layer, is an exciton blocking layer.

6. A solid state photosensitive device according to claim 1 wherein the first electrode has an aperture for admittance of light to the LHC.

7. A solid state photosensitive device according to claim 2 wherein at least one additional layer of photoconductive organic semiconductor material has an aperture for admittance of light to the LHC.

8. A solid state photosensitive device according to claim 6 or claim 7 further comprising an optical concentrator for admittance of light to the LHC.

9. A solid state photosensitive device according to claim 1 wherein the first electrode is substantially transparent to incident light ($\lambda$-800 nm).

10. A solid state photosensitive device according to claim 1 wherein the second electrode is substantially reflective of incident light ($\lambda$-800 nm).

11. A solid state photosensitive device according to claim 4 wherein at least one of the additional layers of photoconductive organic semiconductor material between the electrodes is substantially transparent to incident light ($\lambda$-800 nm).

12. A solid state photosensitive device according to claim 9 wherein the first electrode comprises degenerately doped ITO.

13. A solid state photosensitive device according to claim 10 wherein the second electrode comprises a metallic film such as Al (aluminum), Ag (silver), or Au (gold).

14. A solid state photosensitive device according to claim 1 wherein the electron transport layer comprises a material selected from the group consisting of PTCBl, BCP, Alq3, CBP, F16CuPc, C60, and PTCDA.

15. A solid state photosensitive device according to claim 1 wherein the hole transport layer comprises a material selected from the group consisting of oNPD, TPD, CuPc, CoPc, and ZnPc.

16. A solid state photosensitive device according to claim 2 wherein at least one layer of photoconductive organic semiconductor material, disposed between the first electrode and the electron transport layer comprises a material selected from the group consisting of PTCBl, BCP, Alq3, CBP, F16CuPc, C60, and PTCDA.

17. A solid state photosensitive device according to claim 3 wherein at least one layer of photoconductive organic semiconductor material, disposed between the second electrode and the hole transport layer comprises a material selected from the group consisting of oNPD, TPD, CuPc, CoPc, and ZnPc.

18. A solid state photosensitive device according to claim 5 wherein the exciton blocking layer comprises a material selected from the group consisting of 2,9-dimethyl-4,7-diphenyl-1,10-phenanthroline (BCP); 4,4',4"-tris {N,-(3-methylphenyl)-N -phenylamino}triphenylamine (m-MTDATA); and polyethylene dioxythiophene (PEDOT).

19. A solid state photosensitive device according to claim 1 wherein the Light Harvesting Complex (LHC) is selected from the group consisting of PSl and LH2.

20. A solid state photosensitive device according to claim 1 wherein the distance between the LHC and each electrode is about $\lambda/4n$ wherein $\lambda$ is an important wavelength of light which the LHC absorbs and n is the refractive index of the material between the LHC and each electrode.

21. A solid state photosensitive device according to claim 1 wherein the first electrode is further connected to the second electrode by means of a circuit.

22. A solid state photosensitive device according to claim 21 which is a photovoltaic device.

23. A solid state photosensitive device according to claim 1 comprised of a single layer of Light Harvesting Complexes (LHC).

24. A solid state photosensitive device according to claim 1 comprised of a single Light Harvesting Complex (LHC).

25. A method of generating photocurrent comprising exposing a photovoltaic device of claim 22 to light.

26. A method of supplying power to a circuit comprising exposing a photovoltaic device of claim 22 to light.

27. An electronic device which comprises a solid state photosensitive device according to claim 21.

28. An electronic device which comprises a solid state photosensitive device according to claim 27 selected from the group consisting of solar batteries, optical computing and logic gates, optoelectronic switch, processing element, electronic photo-sensor, sensor, and photonic A/D converter.

* * * * *

UNITED STATES PATENT AND TRADEMARK OFFICE
CERTIFICATE OF CORRECTION

PATENT NO.      : 7,592,539 B2
APPLICATION NO. : 10/704226
DATED           : September 22, 2009
INVENTOR(S)     : Peter Peumans et al.

It is certified that error appears in the above-identified patent and that said Letters Patent is hereby corrected as shown below:

In claim 9, column 14, line 20, "($\lambda$-800 nm)." should read --($\lambda$~800 nm).--.

In claim 10, column 14, line 21, "claim I" should read --claim 1--.

In claim 10, column 14, line 23, "($\lambda$-800 nm)." should read --($\lambda$~800 nm).--.

In claim 11, column 14, line 27, "($\lambda$-800 nm)." should read --($\lambda$~800 nm).--.

In claim 12, column 14, line 30, "ITO." should read --ITO.--.

In claim 14, column 14, line 36, "PTCBl," should read --PTCBI,--.

In claim 14, column 14, line 36, "Alq3," should read --Alq$_3$,--.

In claim 14, column 14, line 37, "F16CuPc, C60," should read --F$_{16}$CuPc, C$_{60}$,--.

In claim 15, column 14, line 40, "oNPD," should read --αNPD,--.

In claim 16, column 14, line 46, "PTCBl," should read --PTCBI,--.

In claim 16, column 14, line 46, "Alq3," should read --Alq$_3$,--.

In claim 16, column 14, line 47, "F16CuPc, C60," should read --F$_{16}$CuPc, C$_{60}$,--.

In claim 17, column 14, line 52, "oNPD," should read --αNPD,--.

UNITED STATES PATENT AND TRADEMARK OFFICE
CERTIFICATE OF CORRECTION

PATENT NO. : 7,592,539 B2
APPLICATION NO. : 10/704226
DATED : September 22, 2009
INVENTOR(S) : Peter Peumans et al.

It is certified that error appears in the above-identified patent and that said Letters Patent is hereby corrected as shown below:

In claim 18, column 14, lines 57-59, "(BCP);4,4',4"-tris {N,-(3-methylphenyl)-N-phenylamino}triphenylamine (m-MT-DATA);" should read --(BCP); 4,4',4"-tris {N,-(3-methylphenyl)-N-phenylamino}triphenylamine (m-MTDATA);--.

In claim 19, column 14, line 62, "PSl" should read --PSI--.

Signed and Sealed this

Twenty-fourth Day of November, 2009

David J. Kappos
*Director of the United States Patent and Trademark Office*